United States Patent
Ahn et al.

(10) Patent No.: US 12,282,044 B2
(45) Date of Patent: Apr. 22, 2025

(54) CIRCUIT BREAKER OPERATING CURRENT/FAULT CURRENT MEASURING DEVICE USING SINGLE ROGOWSKI COIL

(71) Applicant: HYOSUNG HEAVY INDUSTRIES CORPORATION, Seoul (KR)

(72) Inventors: Hyun Mo Ahn, Busan (KR); Joong Kyoung Kim, Busan (KR); Young Hwan Chung, Changwon-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 260 days.

(21) Appl. No.: 18/010,556

(22) PCT Filed: Nov. 23, 2021

(86) PCT No.: PCT/KR2021/017225
§ 371 (c)(1),
(2) Date: Dec. 15, 2022

(87) PCT Pub. No.: WO2023/085485
PCT Pub. Date: May 19, 2023

(65) Prior Publication Data
US 2023/0341441 A1   Oct. 26, 2023

(30) Foreign Application Priority Data
Nov. 12, 2021   (KR) .......................... 10-2021-0156099

(51) Int. Cl.
*G01R 15/18*   (2006.01)
*G01R 31/327*   (2006.01)
(52) U.S. Cl.
CPC ......... *G01R 15/181* (2013.01); *G01R 31/327* (2013.01)

(58) Field of Classification Search
CPC ............... G01R 15/181; G01R 31/327; G01R 19/16547; G01R 31/3271; G01R 19/10; G01R 19/30; H01F 27/30; H01F 38/30
See application file for complete search history.

(56) References Cited

U.S. PATENT DOCUMENTS

| 9,714,974 B2 * | 7/2017 | Ha ........................ G01R 19/165 |
| 2004/0178875 A1 * | 9/2004 | Saito ................... G01R 19/2513 336/200 |

(Continued)

FOREIGN PATENT DOCUMENTS

| JP | 2016017767 A | 2/2016 |
| KR | 10-0605023 B1 | 11/2005 |

(Continued)

*Primary Examiner* — Christopher P McAndrew
*Assistant Examiner* — Zannatul Ferdous
(74) *Attorney, Agent, or Firm* — NKL LAW; Jae Youn Kim

(57) ABSTRACT

The present invention relates to a circuit breaker operating current/fault current measuring device using a single Rogowski coil has an advantage of reducing an installation space and a manufacturing cost by simultaneously measuring an operating current and a fault current with the single Rogowski coil and has an advantage of improving reliability by simultaneously satisfying accuracy required for measurement of the operating current and the fault current. The circuit breaker operating current/fault current measuring device using a single Rogowski coil according to the present invention is configured with a Rogowski coil installed to wrap around a current-carrying conductor, a protection circuit outputting a fault voltage based on a voltage generated from a tap installed on a portion of the Rogowski coil, and a measurement circuit outputting an operating voltage based on a voltage generated in the entire coil of the Rogowski coil.

5 Claims, 2 Drawing Sheets

(56) References Cited

U.S. PATENT DOCUMENTS

2009/0230974 A1\* 9/2009 Kojovic ............... G01R 31/088
                                                            361/42
2018/0059152 A1\* 3/2018 Olivier ............... G01R 19/0092
2019/0302151 A1\* 10/2019 Manikandan ........ H02H 1/0007

FOREIGN PATENT DOCUMENTS

| KR | 10-2011-0009515 A | 1/2011 |
| KR | 10-1169301 B1 | 7/2012 |
| KR | 10-1539376 B1 | 7/2015 |
| KR | 10-2162207 B1 | 10/2020 |
| KR | 10-2216370 B1 | 2/2021 |

\* cited by examiner

CIRCUIT BREAKER OPERATING CURRENT/FAULT CURRENT MEASURING DEVICE USING SINGLE ROGOWSKI COIL

TECHNICAL FIELD

The present invention relates to a device for measuring an operating current and a fault current of a circuit breaker, and specifically, relates to measuring an operating current and a fault current of a circuit breaker using a Rogowski coil.

BACKGROUND ART

With the rapid increase in power demand due to industrial development, the power system also becomes of a large capacity and of an ultra-high voltage, and accordingly, the stabilization and reliability of power facilities become very important issues. Voltage substation facilities according to the rapid increase in power demand are being developed from existing air or oil insulated substation facilities to gas insulated substation facilities.

In general, a circuit breaker is installed in a power system and plays a role in stably protecting the power system. In particular, a gas insulated switchgear (GIS) is a device that is installed on transmission lines or distribution lines to safely protect a power system by opening and closing lines not only in a normal condition but also in an abnormal condition such as ground faults and short circuits.

On the other hand, studies have been made to operate the circuit breaker by effectively detecting the fault current in comparison to the operating current for the circuit breaker such as a gas insulated switchgear, and as an example, Korean Patent Application Publication No. 10-2019-0049662 discloses a circuit breaker provided with a fault detector, in which a fault output device is connected to a distribution system in order to recover, warn, or break an electrical fault caused by short circuit, disconnection, or contact defect on a power side in a single-phase three-line or three-phase four-line distribution system, and when the electric fault occurs in the connected fault output device, a fault current of a neutral line is output, and the fault current is detected.

However, in the related art, there is a concern that, since the sensor for measuring the operating current of the circuit breaker and the sensor for measuring the fault current need to be separately installed, the space required for installation increases, the configuration of the entire system is complicated, and the cost increases.

SUMMARY OF INVENTION

Technical Problem

An object of the present invention is to provide a circuit breaker operating current/fault current measuring device using a single Rogowski coil that can reduce installation space and a manufacturing cost by simultaneously measuring an operating current and a fault current with a single Rogowski coil.

Another object of the present invention is to provide a circuit breaker operating current/fault current measuring device using a single Rogowski coil that improves reliability by simultaneously satisfying the accuracy required for measurement of the operating current and the fault current with the single Rogowski coil.

Solution to Problem

A circuit breaker operating current/fault current measuring device using a single Rogowski coil according to the present invention includes a Rogowski coil installed to wrap around a current-carrying conductor, a protection circuit outputting a fault voltage based on a voltage generated from a tap installed on a portion of the Rogowski coil, and a measurement circuit outputting an operating voltage based on a voltage generated in the entire coil of the Rogowski coil.

Herein, the Rogowski coil may include a donut-shaped air core, a Rogowski inner coil disposed at a center line of the air core inside the air core at a starting point of the air core and a Rogowski outer coil passing through an inside of the air core and connected to the Rogowski inner coil derived from an end point of the air core, and wound in a coil shape on an outside of the air core and disposed as the starting point of the air core.

Meanwhile, the protection circuit may connect the Rogowski outer coil located at the starting point to one input and connect a point of a predetermined ratio of the Rogowski outer coil to the other input.

In addition, the measurement circuit may connect the Rogowski outer coil located at the starting point to one input and connect the Rogowski inner coil located at the starting point to the other input.

At this time, a predetermined ratio of points connected to the input of the protection circuit can be set as a ratio obtained by dividing {maximum operating voltage/maximum operating current} with {maximum fault voltage/maximum fault current}.

In addition, when the maximum fault voltage and the maximum operating voltage are constant, the predetermined ratio may be equal to a ratio obtained by dividing the maximum fault current with the maximum operating current.

Herein, the maximum fault current may be set to allow a current 2 to 3.4 times larger than the rated fault current to be measured.

Meanwhile, the protection circuit and the measurement circuit may be configured with a passive element integrator or an active element integrator.

Advantageous Effects of Invention

A circuit breaker operating current/fault current measuring device using a single Rogowski coil according to the present invention has the advantage of reducing an installation space and a manufacturing cost by simultaneously measuring an operating current and a fault current with a single Rogowski coil.

In addition, the circuit breaker operating current/fault current measuring device using the single Rogowski coil according to the present invention can simultaneously satisfy an accuracy required for measurement of the operating current and the fault current with the single Rogowski coil, so that there is an advantage of improving reliability.

DESCRIPTION OF EMBODIMENTS

Figure 1:
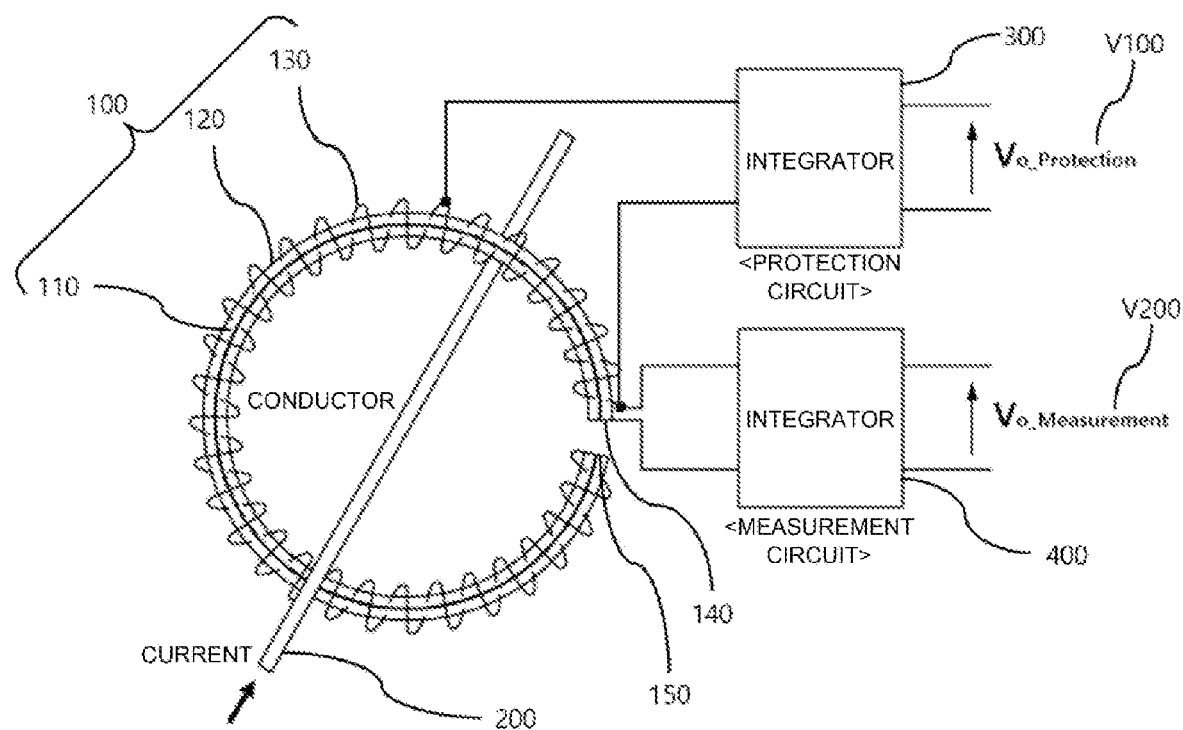
FIG. 1 is a schematic configuration diagram illustrating a circuit breaker operating current/fault current measuring device using a single Rogowski coil according to an embodiment of the present invention.

Specific embodiments for carrying out the present invention will be described with reference to the accompanying drawings.

The present invention can be variously changed and can have various embodiments, and thus, specific embodiments are illustrated in the drawings and described in detail in the detailed description. This is not intended to limit the present invention to a specific embodiment, and it can be understood to include all modifications, equivalents, and substitutes included within the spirit and scope of the invention.

Hereinafter, a circuit breaker operating current/fault current measuring device using a single Rogowski coil according to the present invention will be described in detail with reference to the accompanying drawings.

Figure 2:
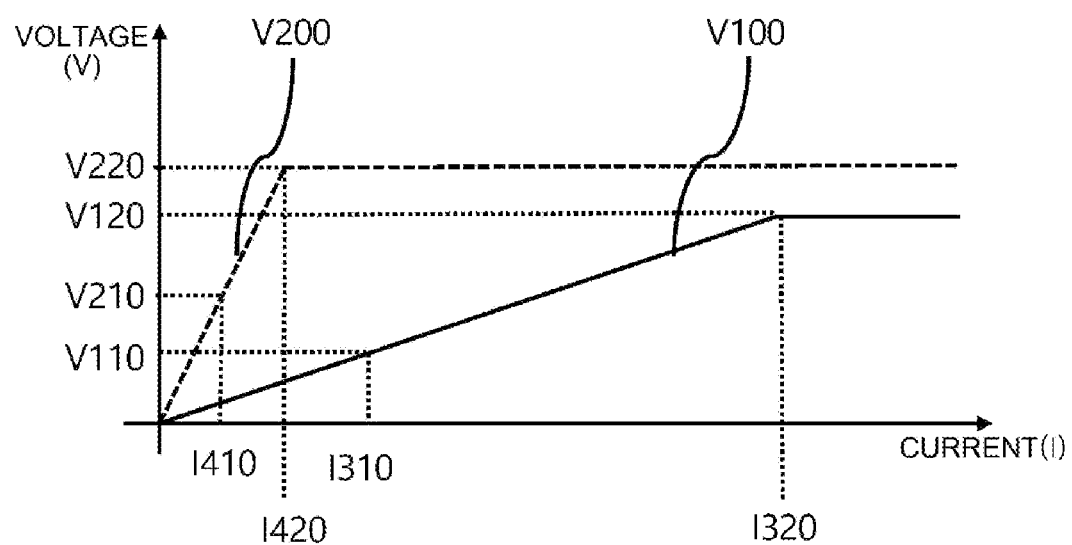
FIG. 2 is a diagram illustrating in detail a method for setting a predetermined ratio of windings for installing taps in a total length of a Rogowski coil in the present invention.

FIG. 1 is a schematic configuration diagram illustrating a circuit breaker operating current/fault current measuring device using a single Rogowski coil according to an embodiment of the present invention, and FIG. 2 is a detailed diagram illustrating FIG. 1 in detail.

Hereinafter, a circuit breaker operating current/fault current measuring device using a single Rogowski coil according to an embodiment of the present invention will be described with reference to FIGS. 1 and 2.

First, referring to FIG. 1, the circuit breaker operating current/fault current measuring device using the single Rogowski coil includes: a Rogowski coil 100 installed to wrap around a current-carrying conductor 200, a protection circuit 300 outputting a fault voltage V100 by performing integration based on a voltage generated in a partial coil of the Rogowski coil 100, and a measurement circuit 400 outputting an operating voltage V200 by performing integration based on a voltage generated in the entire coil of the Rogowski coil 100.

Herein, the Rogowski coil 100 is configured with a donut-shaped air core 120, a Rogowski inner coil 110 disposed at the center line of the air core 120 inside the air core 120 at a starting point 140 of the air core, and a Rogowski outer coil 130 passing through the inside of the air core 120 and connected to the Rogowski inner coil 110 derived from the end point 150 of the air core 120 and wound in a coil shape on the outside of the air core 120 and disposed as the starting point 140.

The protection circuit 300 connects the Rogowski outer coil 130 located at the starting point 140 of the Rogowski coil 100 as one input and connects a point of a predetermined ratio of the Rogowski outer coil 130 connected to an end point 150 of the Rogowski coil 100 as the other input.

The measurement circuit 400 connects the Rogowski outer coil 130 located at the starting point 140 of the Rogowski coil 100 to one input and connects the Rogowski inner coil 110 located at the starting point 140 of the Rogowski coil 100 to the other input.

That is, the Rogowski coil 100 according to the present invention is installed with a tap in windings of a predetermined ratio of a total length of the Rogowski coil 100, and thus, a voltage output is obtained in a middle region of the Rogowski coil 100. At this time, the voltage output from the tap installed in the Rogowski coil 100 is determined by the winding ratio of the windings with the tap in comparison to the entire windings of the Rogowski coil 100.

Herein, the total length of the Rogowski coil 100 is set so that the maximum value of the operating voltage of the measurement circuit 400 can be derived from the maximum value of the operating current in the conductor 200, and the winding ratio of the windings installed with the tap in comparison to the entire windings of the Rogowski coil 100 is set so that the maximum value of the operating voltage of the protection circuit 300 can be derived from the maximum value of the fault current in the conductor 200.

That is, when the maximum value of the operating voltage of the measurement circuit 400 is output from the measurement circuit 400, it denotes that the current flowing through the conductor 200 has reached the maximum value of the operating current, and when the maximum value of the operating voltage of the protection circuit 300 is output from the protection circuit 300, it denotes that the current flowing through the conductor 200 has reached the maximum value of the fault current.

Meanwhile, the protection circuit 300 and the measurement circuit 400 outputs the integrating value of the current generated in the Rogowski coil 100 and the voltage therefor, and then, predicts the current flowing through the conductor 200 from the output voltage.

That is, the protection circuit 300 and the measurement circuit 400 may be configured by using a passive element integrator or an active element integrator. At this time, in a case of using an operational amplifier, the maximum output voltage may be limited due to the operating voltage of the operational amplifier in terms of characteristics of the operational amplifier, and since there is a lot of noise at a low output voltage, the rated operation is suitable for use in the middle region of the operating voltage applied to the operational amplifier.

The circuit breaker operating current/fault current measuring device using a single Rogowski coil according to the present invention can simultaneously measure the fault current and the operating current by using the single Rogowski coil, and thus, can reduce the installation space and the manufacturing cost in comparison to those in the method in the related art.

Next, a method for setting a predetermined ratio of windings for installing taps in the total length of the Rogowski coil 100 in the present invention will be described in detail with reference to FIG. 2.

FIG. 2 is an I-V (current-voltage) graph illustrating the fault voltage V100 and operating voltage V200 of FIG. 1 in detail, and as can be seen in FIG. 2, in the present invention, a predetermined ratio of windings connected to the input of the protection circuit 300, that is, a winding ratio of the windings in comparison to the entire windings of the Rogowski coil 100 is set as a ratio obtained by dividing {maximum operating voltage V220/maximum operating current I420} with {maximum fault voltage V120/maximum fault current I320}.

At this time, when the maximum fault voltage V120 and the maximum operating voltage V220 are constant, the predetermined ratio of the windings is equal to the ratio obtained by dividing the maximum fault current I320 with the maximum operating current I420.

Meanwhile, the maximum fault current I320 is set so that a current 2 to 3.4 times larger than the rated fault current I310 can be measured.

As described above, the protection circuit 300 and the measurement circuit 400 can be implemented as a passive element integrator or an active element integrator, and in a case of using an operational amplifier, in terms of characteristics of the operational amplifier, it is desirable to allow the rated operation to be performed in the middle region.

Since the fault current has many peaks in terms of characteristics, it is appropriate to set the maximum fault current I320 to be 2.7 times the rated fault current I310 in order for the rated fault current I310 to operate in a stable region of the protection circuit 300, and set the maximum fault current I320 to 2 to 3.4 times the rated fault current I310 including a margin.

For example, when the rated operating current I410 is 3,150 A, the maximum operating current I420 can be set to 6,300 A that is twice the rated operating current I410, and when the rated fault current I310 is 40 kA, the maximum fault current I320 can be set to 108 kA that is 2.7 times the rated fault current I310.

Meanwhile, the current generated in the Rogowski coil 100 is proportional to the number of turns of the Rogowski outer coil 130, and the number of turns of the Rogowski outer coil 130 is set to output the maximum operating voltage V220 for the maximum operating current I420.

Herein, the slope of the fault voltage V100 and the operating voltage V200 may change according to the number of turns of the Rogowski outer coil 130, and that is, when the number of turns is small, the slope becomes small, and when the number of turns is large, the slope also becomes large.

Therefore, the slope ratio of the fault voltage V100 and the operating voltage V200 is equal to a ratio of the number of turns of the Rogowski outer coil 130, and the ratio of {maximum operating voltage V220/maximum operating current I420} that is the slope of the operating voltage V200 and {maximum fault voltage V120/maximum fault current I320} that is the slope of the fault voltage V100 becomes the ratio of the number of turns of the Rogowski outer coil 130 used in the measurement circuit 400 and the protection circuit 300.

At this time, when the maximum fault voltage V120 and the maximum operating voltage V220 are constant, the ratio of {maximum operating voltage V220/maximum operating current I420} that is the slope of the operating voltage V200 and {maximum fault voltage V120/maximum fault current I320} that is the slope of the fault voltage V100 becomes {maximum fault current I320/maximum operating current I420}, which is the winding ratio connected to the input of the protection circuit 300.

As described above, the circuit breaker operating current/fault current measuring device using a single Rogowski coil according to the present invention allows the protection circuit 300 and the measurement circuit 400 to operate stably in a stable middle region for ratings of the fault current I300 and the operating current I400, so that there is an advantage of improving reliability by simultaneously satisfying the accuracy required by the circuit breaker.

As described above, the circuit breaker operating current/fault current measuring device using a single Rogowski coil according to the present invention has the advantage of reducing the installation space and the manufacturing cost by simultaneously measuring the operating current and the fault current with the single Rogowski coil and has the advantage of improving reliability by simultaneously satisfying the accuracy required for the measurement of the operating current and the fault current.

The foregoing description includes examples of one or more embodiments. While the present invention has been particularly illustrated and described with reference to exemplary embodiments thereof, it should be understood by the skilled in the art that the invention is not limited to the disclosed embodiments, but various modifications and applications not illustrated in the above description can be made without departing from the spirit of the invention. In addition, differences relating to the modifications and applications should be construed as being included within the scope of the invention as set forth in the appended claims.

INDUSTRIAL APPLICABILITY

The present invention relates to a device for measuring an operating current and a fault current of a circuit breaker, and can be used for a circuit breaker current measuring device.

The invention claimed is:

1. A circuit breaker operating current/fault current measuring device, comprising:
   a Rogowski coil installed to wrap around a current-carrying conductor;
   a protection circuit outputting a fault voltage based on a voltage generated from a tap installed on a portion of the Rogowski coil; and
   a measurement circuit outputting an operating voltage based on a voltage generated in the Rogowski coil,
   wherein the Rogowski coil includes:
   a donut-shaped air core;
   a Rogowski inner coil disposed at a center line of the air core inside the air core and at a starting point of the air core; and
   a Rogowski outer coil passing through an inside of the air core and connected to the Rogowski inner coil derived from an end point of the air core, and wound in a coil shape on an outside of the air core and disposed as the starting point of the air core,
   wherein the protection circuit connects the Rogowski outer coil located at the starting point as one input and connects a point of a predetermined ratio of the Rogowski outer coil connected to the end point as another input, and
   wherein the point of the predetermined ratio connected as the another input of the protection circuit is obtained by dividing {maximum operating voltage/maximum operating current} with {maximum fault voltage/maximum fault current}.

2. The circuit breaker operating current/fault current measuring device according to claim 1, wherein the measurement circuit connects the Rogowski outer coil located at the starting point as one input and connects the Rogowski inner coil located at the starting point as another input.

3. The circuit breaker operating current/fault current measuring device according to claim 1, wherein the predetermined ratio is equal to a ratio obtained by dividing the maximum fault current with the maximum operating current when the maximum fault voltage and the maximum operating voltage are constant.

4. The circuit breaker operating current/fault current measuring device according to claim 1, wherein the maximum fault current is set to allow a current 2 to 3.4 times a rated fault current to be measured.

5. The circuit breaker operating current/fault current measuring device using according to claim 1, wherein the protection circuit and the measurement circuit are configured with a passive element integrator or an active element integrator.

* * * * *